United States Patent [19]

Taylor et al.

[11] Patent Number: 5,034,754
[45] Date of Patent: Jul. 23, 1991

[54] MAGNETIC PATTERN VIEWER

[75] Inventors: Robert J. Taylor; John A. Watt, both of Newport, United Kingdom

[73] Assignee: British Steel plc, England

[21] Appl. No.: 492,795

[22] Filed: Mar. 13, 1990

[30] Foreign Application Priority Data

Mar. 21, 1989 [GB] United Kingdom ............... 8906506

[51] Int. Cl.$^5$ ........................... G11B 9/00; B43L 1/00
[52] U.S. Cl. ...................................................... 346/743
[58] Field of Search ............................ 346/74.2–74.7; 434/409

[56] References Cited

U.S. PATENT DOCUMENTS

| | | | |
|---|---|---|---|
| 3,013,206 | 12/1961 | Youngquist et al. | 346/74.3 X |
| 3,320,523 | 5/1967 | Trimble | 346/74.2 X |
| 3,972,595 | 8/1976 | Romankiw et al. | 350/267 |
| 3,988,738 | 10/1976 | Wu | 346/74.1 |
| 4,143,472 | 3/1979 | Murata et al. | 434/409 |

Primary Examiner—George H. Miller, Jr.
Attorney, Agent, or Firm—Bacon & Thomas

[57] ABSTRACT

This invention provides a device for visually displaying magnetic patterns assumed within or recorded on a planar medium, e.g. electrical steel sheet, comprising a transparent plate and a membrane secured to and spanning the plate defining a sealed area therebetween housing magnetic particles suspended in a liquid carrier. A field is applied by permanent magnet(s) disposed around the periphery of the plate or by an energized coil for subjecting said particles to a magnetic field in a direction normal to the plate whereby, when placed in juxtaposition with the planar medium the particles agglomerate to assume positions in conformity with the magnetic patterns.

10 Claims, 1 Drawing Sheet

MAGNETIC PATTERN VIEWER

The invention relates to a viewer by which magnetic patterns assumed within or recorded on a planar medium may be visually displayed. The invention is particularly, but not exclusively, directed to visually displaying magnetic domain structures in electrical steel sheet. In this regard power loss in such steels is closely linked with the domain structure of the material; thus, it is important to be able to observe the structure as an aid to the assessment of quality and to initiate corrective action as necessary in the production control.

Whilst various forms of non-destructive magnetic readers exist for e.g. viewing magnetic patterns in tubes, discs, card etc., these are not suitable or convenient for the primary purpose to which this invention is directed.

The present invention provides a device for visually displaying magnetic patterns assumed within or recorded on a planar medium, comprising a transparent plate, a membrane secured to and spanning the plate defining a sealed area therebetween housing magnetic particles suspended in a liquid carrier, and means for subjecting said particles to a magnetic field in a direction normal to the plate whereby, when placed in juxtaposition with the planar medium the particles agglomerate to assume positions in conformity with the magnetic patterns.

The field may be applied by permanent magnet(s) disposed around the periphery of the plate or by a coil energised as appropriate.

The plate may conveniently be a circular disc of perspex or the like and the membrane may be a plastics film e.g. a polymer, white or light coloured to enhance the contrast with the particles for ease of viewing. The particles themselves may be iron oxide or finely divided iron; the carrier may be a soap solution.

In order that the invention may be fully understood one embodiment thereof will now be described, by way of example with reference to the accompanying drawings, in which.

Figure 1:
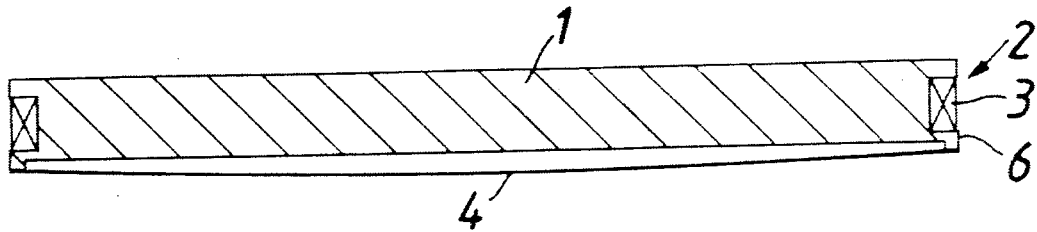
FIG. 1 is a sectional side elevation of the viewer.

Referring now to FIG. 1 a circular-section plate 1 of e.g. perspex 10 cm in diameter has a peripheral recess 2 formed in it within which is wound a coil 3 energised from a supply source, not shown. A white polyvinyl chloride membrane 4 e.g. 35$\mu$ thick, is secured to the underside of the plate which is slightly recessed so on to define a cavity about 0.5 mm deep between the plate and membrane, this is filled via port 6 with an aqueous solution incorporating a proprietary detergent in which is suspended carbonyl iron powder. The size of the cavity for this slurry is such that the membrane 'bellies out' somewhat beyond the underside of the perspex plate itself —this is so to ensure adequate planar contact with the steel sheet under investigation.

Figure 2:
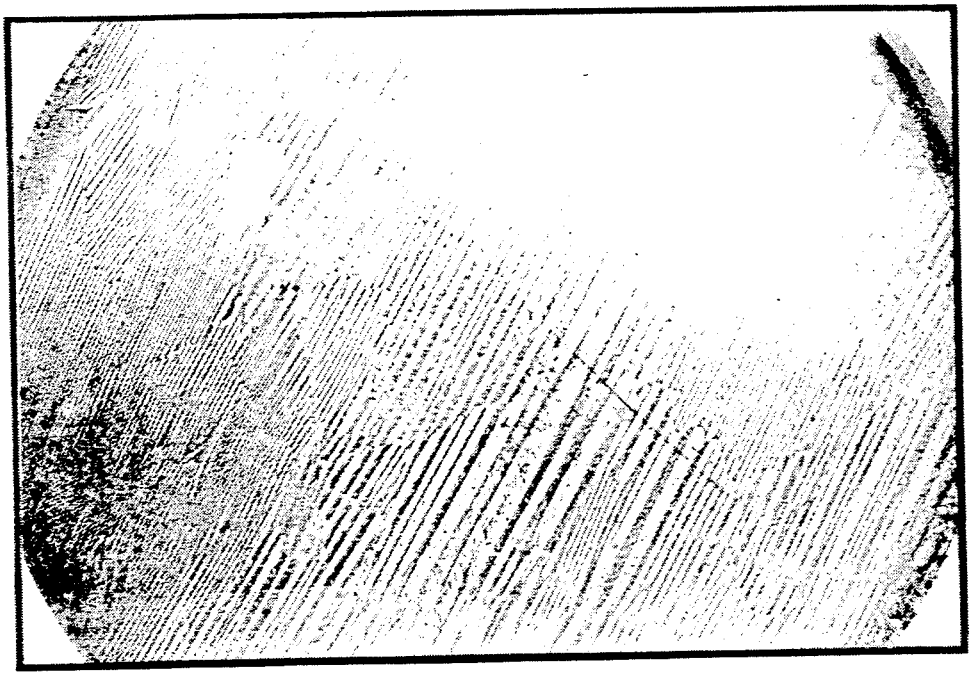
FIG. 2 is a typical structure of grain oriented electrical steel as viewed in the FIG. 1 device.

In operation, the device is first shaken to distribute the particles in solution evenly, making the viewer opaque. It is then placed —underside down —on to the steel sheet under investigation and the coil is energised, typically producing a field of up to 50 oersted. The iron particles agglomerate and migrate into 'mounds' to the areas of the high field in conformity with the magnetic domain patterns in the sheet, e.g. the surface coated electrical steel as depicted in FIG. 2 —the contrast is clearly seen against the white membrane. The pattern is largely retained even following the removal of the energised field.

For subsequently viewing another area the device may be rotated through 90°, set down and gently tapped whereupon the particles adopt the fresh domain pattern.

This invention thus provides a simple compact, portable device with a very short response time for non-destructively viewing magnetic domains clearly, even through surface coated steel sheet, and, as mentioned above, it could readily be utilised for purposes other than that described in the production of electrical steels.

The 'cell' beneath the transparent plate may readily be made as a separable, replaceable item since it is envisaged that damage to the membrane could be occasioned. In this regard the membrane may be made from a stronger material than the pvc exemplified. Indeed a non-ferrous metallic foil could be employed e.g. dispersion hardened aluminium; any signigicant thickening of this membrane for strengthening purposes will unfortunately tend to reduce the sensitivity of course which cannot readily be overcome by increasing the applied magnetic field since this could swamp the field in the steel sheet under investigation.

Additionally, since as with most polymers the membrane is not entirely impermeable to water provision may be made to top-up the cavity from time-to-time with distilled water. Moreover, since air bubbles may be generated within the cavity a 'bubble trap' in the form of a reservoir adjacent the periphery of the plate may be provided such that, by holding the viewer vertically with the reservoir uppermost the bubbles migrate into same.

We claim:

1. A device for visually displaying magnetic patterns assumed within or recorded on a planar medium, comprising a transparent plate, a membrane secured to and spannning the plate defining a sealed area therebetween housing magnetic particles suspended in a liquid carrier, and means for subjecting said particles to a magnetic field, wherein said magnetic field is generated by an electrically energized coil disposed around the periphery of the plate and is in a direction normal to the plate whereby, when placed in juxtaposition with the planar medium the particles agglomerate to assume positions in conformity with the magnetic patterns.

2. A device according to claim 1, in which the membrane is a film of transparent or translucent plastics material.

3. A device according to claim 2, in which the particles are iron oxide or finely divided iron.

4. A device according to claim 3, in which the field is generated by an electrically energised coil disposed around the periphery of the plate.

5. A device according to claim 3, in which the field is generated by a series of permanent magnets disposed around the periphery of the plate.

6. A device according to claim 4, in which the liquid carrier is an aqueous soapy solution.

7. A device according to claim 6, in which the plate is a circular disc of plastics material, e.g. perspex.

8. A device for visually displaying magnetic patterns assumed within or recorded on a planar medium, comprising a transparent plate of plastics material, a transparent or translucent plastics membrane secured to and spanning the plate defining a sealed area therebetween, a liquid solution housed within said area and embodying particulate iron or iron oxide in suspension therein, and an electrical coil disposed around the periphery of the plate, the arrangement being such that, on energisation of said coil the particulate matter is subjected to a magnetic field in a direction normal to the plate whereby, when placed in juxtaposition with the planar medium, the particles agglomerate to assume positions in comformity with the magnetic patterns.

9. A device according to claim 8, in which the liquid is an aqueous soapy solution.

10. A device for visually displaying magnetic patterns assumed within or recorded on a planar medium, comprising a transparent plate, a membrane secured to and spanning the plate defining a sealed area therebetween housing magnetic particles suspended in a liquid carrier, and means for subjecting said particles to a magnetic field, wherein said magnetic field is generated by a series of permanent magnets disposed around the periphery of the plate and is in a direction normal to the plate whereby, when placed in juxtaposition with the planar medium the particles agglomerate to assume positions in conformity with the magnetic patterns.

* * * * *